United States Patent [19]
Johnson et al.

[11] Patent Number: 4,755,145
[45] Date of Patent: Jul. 5, 1988

[54] ELECTRICALLY CONNECTING CIRCUIT BOARD SYSTEM

[75] Inventors: Lennart B. Johnson, Milford; William B. Walkup, Amherst, both of N.H.

[73] Assignee: Teradyne, Inc., Boston, Mass.

[21] Appl. No.: 731,063

[22] Filed: May 6, 1985

Related U.S. Application Data

[63] Continuation of Ser. No. 440,815, Nov. 12, 1982, abandoned.

[51] Int. Cl.[4] .............................................. H01R 9/09
[52] U.S. Cl. ..................................... 439/61; 439/101
[58] Field of Search .......... 339/17 LC, 17 L, 17 LM, 339/17 C, 17 M, 17 R, 21 R, 21 S, 22 B, 147 R, 14 R, 14 P; 439/61, 92, 101, 108

[56] References Cited

U.S. PATENT DOCUMENTS

| | | | |
|---|---|---|---|
| 2,701,346 | 2/1955 | Powell | 339/17 M |
| 2,832,942 | 4/1953 | French | 339/17 LM |
| 2,877,388 | 3/1959 | Reid, Jr. et al. | 339/17 LM |
| 2,992,401 | 7/1961 | Lewis | 339/22 B |
| 3,107,319 | 10/1963 | Vizzier, Sr. | 339/17 LM |
| 3,287,686 | 11/1966 | Ruehlemann | 339/17 LM |
| 3,323,099 | 5/1967 | Spera | 339/17 LM |
| 3,470,421 | 9/1969 | Shore et al. | 339/17 L |
| 3,533,044 | 10/1970 | Bauman et al. | 339/14 R |
| 3,732,523 | 5/1973 | Fouse et al. | 339/22 B |
| 4,405,189 | 9/1983 | Douty et al. | 439/79 |

*Primary Examiner*—Neil Abrams

[57] ABSTRACT

A plurality of daughter printed circuit boards are detachably mounted on a backplane and electrically connected to a bus bar on the same side of the backplane via contacts on the daughter boards that mate with contact portions of the bus bar.

13 Claims, 1 Drawing Sheet

ELECTRICALLY CONNECTING CIRCUIT BOARD SYSTEM

This application is a continuation of application Ser. No. 440,815, filed Nov. 12, 1982, now abandoned.

FIELD OF THE INVENTION

The invention relates to systems for detachably mounting a plurality of daughter printed circuit boards (PCBs) on a backplane.

BACKGROUND OF THE INVENTION

Backplanes are printed circuit boards or metal plates on the upper side of which "daughter" PCBs are detachably mounted perpendicularly to the backplanes for easy removal and replacement while the circuit is still being powered. One way of electrically connecting the daughter boards to other daughter boards, the backplane, and other circuitry is by providing metallized surface portions near the edges of the daughter boards and inserting them between the forked prongs of electrical connectors that are secured to the backplane. Another way of making electrical connection to the daughter boards involves using post and box connectors. The connectors secured to the backplane often have connector posts extending from the lower side of the backplanes for receiving wires connecting selected pairs of posts, and bus bars are often connected to a line of connector posts under the backplane to distribute voltage to a plurality of posts. These connections to the daughter boards are typically designed to carry small amounts of current; thus, a large number of contacts are connected in parallel when large amounts of current are needed.

SUMMARY OF THE INVENTION

It has been discovered that space can be conserved and better electrical connection between the components on the daughter boards and the bus bars can be provided, to result in less current resistance and increased reliability, by mounting the bus bar on the same side of the backplane as the daughter boards, and providing the daughter boards with contacts that directly mate with contact portions on the bus bars. In preferred embodiments, the bus bar contact portions comprise a male portion extending along the length of the bus bar and transversely to the backplane; the daughter board contacts have forked prongs for engaging the male portion, and a daughter board has more than one forked contact for mating with a single bus bar to provide increased current carrying capacity. In one embodiment the bus bar is connected to the backplane via a dielectric housing, and in another embodiment the bus bar has connector posts that extend through holes in the backplane.

DESCRIPTION OF THE PREFERRED EMBODIMENT

The structure and operation of the presently preferred embodiment of the invention will now be described after first briefly describing the drawings.

DRAWINGS

STRUCTURE

Figure 1:
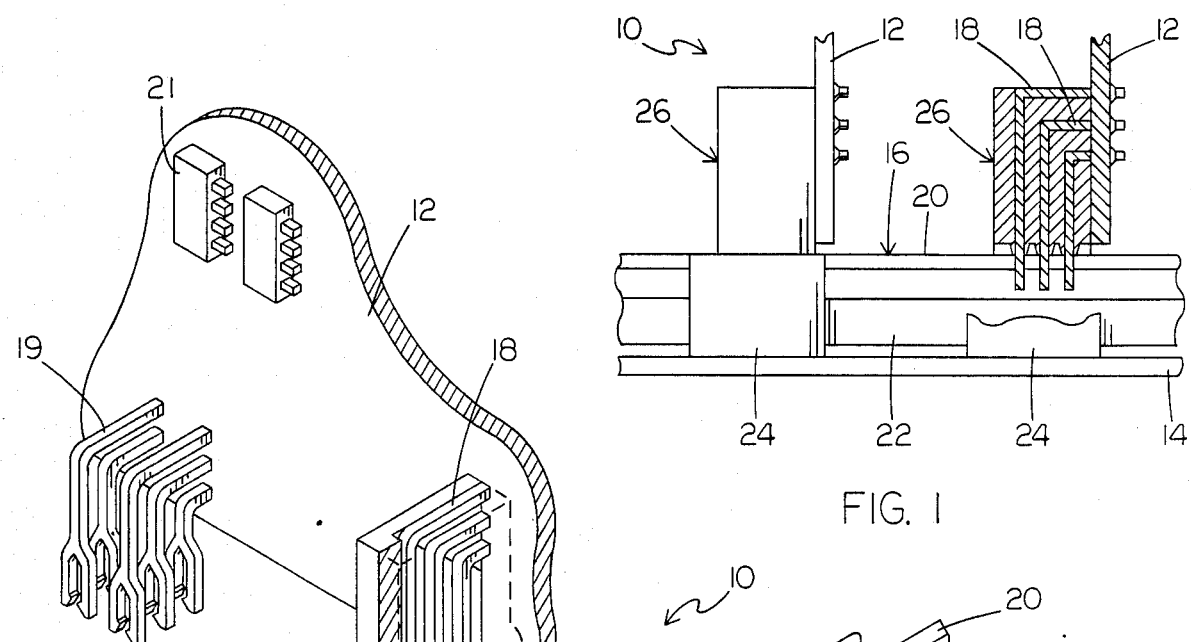
FIG. 1 is an elevation, partially broken away, of a system for detachably mounting a plurality of daughter printed circuit boards on a backplane.
Figure 2:
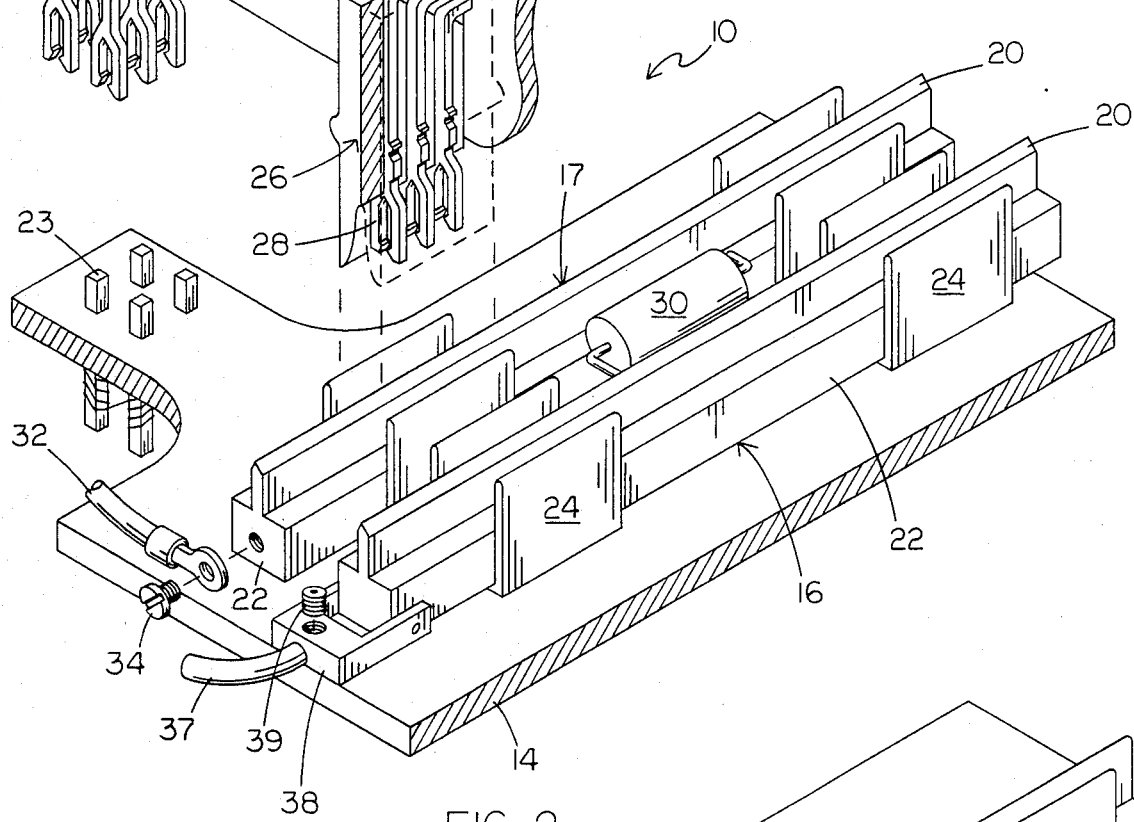
FIG. 2 is a perspective view, partially broken away, of the FIG. 1 system, with a daughter board shown disconnected from the backplane.

Referring to FIGS. 1 and 2, there is shown daughter board mounting system 10 including daughter boards 12 mounted on backplane 14 and electrically connected to bus bars 16, 17 via female contacts 18 engaging mating male contact portions 20 of bus bars 16, 17. Although not completely shown on FIGS. 1 and 2, daughter boards 12 each have a plurality of female contacts 18 on them for making electrical connection with bus bars 16, 17 and other bus bars not shown. On other daughter boards 12, there also are other contacts 19 for making electrical connection between the components 21 on different daughter boards via, for example, wire wrapped connector posts 23 or other conductors carried by the backplane for making electrical connection between components on different daughter boards, as is well-known in the industry.

Bus bars 16, 17 are made of copper and in their present embodiment have 0.140" high and 0.150" wide base portions 22 under vertically extending male portions 20, which in this embodiment are 0.025" thick. Bars 16, 17 are mounted on and electrically insulated from backplane 14 by dielectric housings 24. Capacitor 30 is directly connected between bus bars 16, 17. Bus bar 17 is connected to lead 32 by screw 34 for screwing into threaded hole 36, and bus bar 17 has connector 38 attached to it for receiving lead 37, which is held in place by a set screw 39. The bus bar used for ground is mounted higher than the other voltage distributing bus bars to guarantee that when daughter boards 12 are connected, they make electrical contact with the ground bus bar first.

Female contacts 18 are the well known tuning fork type contacts meeting military specification MIL-C-28754, and each can carry 5+ amps. They are soldered to metallized portions on daughter boards 12 and are embedded in insulators 26, which are shaped to provide a snug fit within the upwardly extending portions of housings 24 when the forked prongs 28 are slid over male portions 20. Portions of contacts 18 attached to daughter boards 12 are positioned vertically in line, and are electrically connected in parallel, thus providing increased current carrying capacity without using up space along the width of boards 12.

OPERATION

In operation, daughter boards 12 can be easily attached and electrically connected to backplane 14 by lowering them to engage the bus bars and other connectors on the backplane. Because the ground bus bar is higher than the other bus bars, the daughter boards make contact with ground first to prevent damage to the components. Because the bus bars are on the same side of the backplane as the daughter boards and are directly connected to the daughter boards, space is conserved and there is good electrical conduction between the components on the daughter boards and the bus bars. Placing the bus bars on the same side as the daughter boards also provides space for easily attaching capacitors between the bus bars and avoids the problem of interference of the bus bars with the wires wrapped to connector posts.

OTHER EMBODIMENTS

Figure 3:
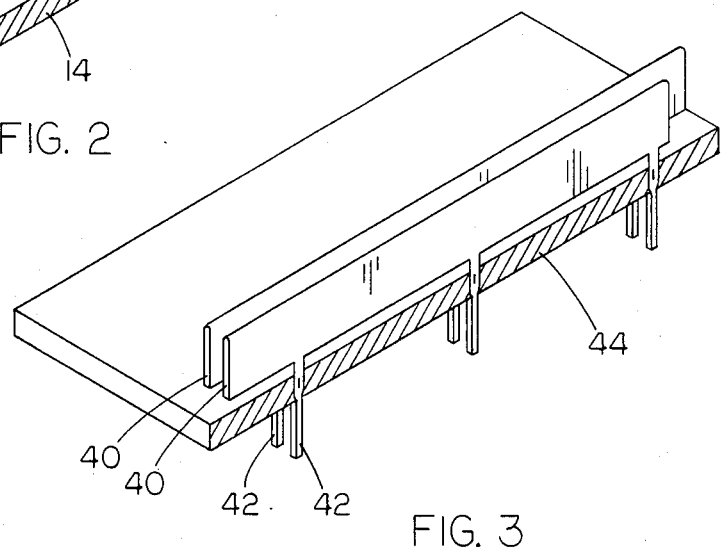
FIG. 3 is a perspective view, partially broken away, showing an alternative bus bar construction for use in said system.

Other embodiments of the invention are within the scope of the appended claims. By way of example, as is shown in FIG. 3, one can use bus bars 40, having connector posts 42 for making electrical connection with conducting portions of backplane 44. Also, in addition to copper, other rigid, electrically conducting materials such as phosphor bronze and brass can be used for the bus bars.

What is claimed is:

1. a system for detachably mounting a plurality of daughter printed ciruit boards on a backplane, said system comprising A backplane including conductors for making electrical connection between components on different daughter printed circuit boards mounted thereon, at least one elongated bus bar mounted on one side of said backplane, said bus bar extending along an axis, being made of an amount of electrically conductive material sufficient to distribute voltage or ground to a plurality of daughter printed circuit boards and having accesssible contact portions along said axis, said accessible portions comprising blades, means for mounting a plurality of daughter printed circuit boards on said backplane, and a plurality of daughter printed circuit boards mounted on said backplane and having bottom edges along the surface on said one side of said backplane, each of said daughter printed circuit boards lying in a different plane perpendicular to said backplane and transversely to the axis of said bus bar, each of said daughter printed circuit boards carrying electrical components, said daughter boards each having at least one daughter contact shaped to mate with one of said accessible contact portions, said daughter contacts being female contacts having forked prongs spaced so as to engage said blades therebetween, said daughter boards each having an insulator member surrounding said daughter contact and having an opening in the bottom thereof providing access for electrical engagement of said blades to said forked prongs, said plurality of daughter printed cirucit boards also including other contacts electrically connected to components on respective daughter boards and to said conductors of said backplane to make electrical connection between the components on different daughter boards of said plurality of daughter printed circuits boards, whereby good direct electrical contact is provided between said daughter printed circuit boards and said bus bar and backplane space is conserved.

2. The system of claim 1 wherein said contact portions comprise a male portion extending transversely to the backplane along the length of said bus bar, and said daughter contacts are female contacts with forked prongs that engage opposite sides of said male portion.

3. The system of claim 2 wherein there are a plurality of female contacts on a said daughter board for making connection with a common said bus bar, said female contacts for said common bus bar being attached to said daughter board in alignment along an axis transverse to both said bus bar and said backplane.

4. The system of claim 2 wherein said bus bar is mounted on said backplane via a dielectric housing.

5. The system of claim 4 wherein said bus bar has a portion below said male portion that has a larger width than said male portion.

6. The system of claim 2 wherein said bus bar has connector posts that extend through said backplane.

7. The system of claim 1 further comprising a second bus bar and a capacitor connected between said bus bars.

8. The system of claim 2 wherein there are two bus bars, and one said bus bar is higher than the other bus bar.

9. The system of claim 1 wherein said bus bar is made of copper, phosphor bronze, or brass.

10. The system of claim 2 wherein said male portion is 0.022" thick.

11. The system of claim 2, 3 or 10 wherein each said daughter connector has sufficient current carrying capacity to carry at least 5 amps.

12. The system of claim 1 wherein said bus bar is made of a single piece of metal.

13. A system for detachably mounting a plurality of daughter printed circuit boards on a backplane, said system comprising a backplane including conductors for making electrical connection between components on different daughter printed circuit boards mounted thereon, at least one elongated bus bar mounted on one side of said backplane, said bus bar extending along an axis, being made of an amount of electrically conductive material sufficient to distribute voltage or ground to a plurality of daughter printed circuit boards and having accessible contact portions, along said axis, said accessible portions comprising blades, means for mounting a plurality of daughter printed circuit boards on said backplane, said means for mounting including an inslulator housing located on said backplane and having two upwardly extending portions, and a plurality of daughter printed circuit boards mounted on said backplane and having bottom edges along the surface on said one side of said backplane, each of said daughter printed circuit boards lying in a different plane perpendicular to said backplane and transversely to the axis of said bus bar, each of said daughter printed circuit boards carrying electrical components, said daughter boards each having at least one daughter contact shaped to mate with one of said accessible contact portions, said daughter contacts being female contacts having forked prongs spaced so as to engage said blades therebetween, said daughter boards each having an insulator member surrounding said daughter contact and having an opening in the bottom thereof providing access for electrical engagmeent of said blades to said forked prongs, said insluator member removably fitting snugly between said two upwardly extending portions of said housing, said plurality of daughter printed circuit boards also including other contacts electrically connected to components on respective daughter boards and to said conductors of said backplane to make electrical connection between the components on different daughter boards of said plurality of daughter printed circuits boards, whereby good direct electrical contact is provided between said daughter printed circuit boards and said bus bar and backplane space is conserved.

* * * * *